(12) United States Patent
Kondo

(10) Patent No.: US 11,039,504 B2
(45) Date of Patent: Jun. 15, 2021

(54) METHODS AND APPARATUS FOR A POWER SUPPLY CONTROL CIRCUIT

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 279 days.

(21) Appl. No.: 16/148,072

(22) Filed: Oct. 1, 2018

(65) Prior Publication Data

US 2020/0107405 A1    Apr. 2, 2020

(51) Int. Cl.
| | | |
|---|---|---|
| *H05B 1/02* | (2006.01) | |
| *H05B 3/44* | (2006.01) | |
| *A24F 47/00* | (2020.01) | |
| *G01R 31/382* | (2019.01) | |
| *G01R 31/389* | (2019.01) | |
| *G01R 31/392* | (2019.01) | |
| *G01R 31/36* | (2020.01) | |
| *G01R 31/3842* | (2019.01) | |

(52) U.S. Cl.
CPC ......... *H05B 1/0291* (2013.01); *A24F 47/008* (2013.01); *G01R 31/382* (2019.01); *H05B 1/0202* (2013.01); *H05B 3/44* (2013.01); *G01R 31/3647* (2019.01); *G01R 31/389* (2019.01); *G01R 31/3842* (2019.01); *G01R 31/392* (2019.01)

(58) Field of Classification Search
CPC ...... H05B 1/0291; H05B 1/0202; H05B 1/02; H05B 3/44; G01R 31/382; G01R 31/389; G01R 31/392; G01R 31/3647; G01R 31/3842; A24F 47/008
USPC ................. 219/482, 492, 497, 505, 483–486
See application file for complete search history.

(56) References Cited

U.S. PATENT DOCUMENTS

| | | | |
|---|---|---|---|
| 10,064,434 B2* | 9/2018 | Zitzke | ............... A24F 47/008 |
| 10,455,862 B2* | 10/2019 | Zeng | ................. A24F 47/008 |
| 10,511,050 B1* | 12/2019 | Rahimian | ......... H01M 10/4207 |
| 2014/0270727 A1 | 9/2014 | Ampolini | |
| 2014/0345606 A1 | 11/2014 | Talon | |
| 2015/0027472 A1* | 1/2015 | Amir | ................... A24F 47/008 131/329 |
| 2015/0128965 A1 | 5/2015 | Lord | |
| 2015/0136153 A1 | 5/2015 | Lord | |
| 2015/0166045 A1 | 6/2015 | Chen | |
| 2015/0208727 A1 | 7/2015 | Kuczaj | |
| 2016/0174610 A1 | 6/2016 | Kuczaj | |

(Continued)

FOREIGN PATENT DOCUMENTS

WO    2009118085 A1    10/2009

*Primary Examiner* — Mark H Paschall
(74) *Attorney, Agent, or Firm* — The Noblitt Group, PLLC; Hettie L. Haines

(57) ABSTRACT

Various embodiments of the present technology comprise a method and apparatus for a power supply control circuit. In various embodiments, the apparatus is adapted to control the power supplied by a battery to a heating element. The apparatus may comprise a memory for storing known data and circuitry configured to control the delivery of power from the battery to the heating element according to measured parameters, calculated parameters, and the known data.

20 Claims, 12 Drawing Sheets

(56) References Cited

U.S. PATENT DOCUMENTS

2017/0123011 A1    5/2017   Cha
2017/0146608 A1*   5/2017   Lee ..................... G01R 31/392
2017/0224019 A1    8/2017   Kuczaj

* cited by examiner

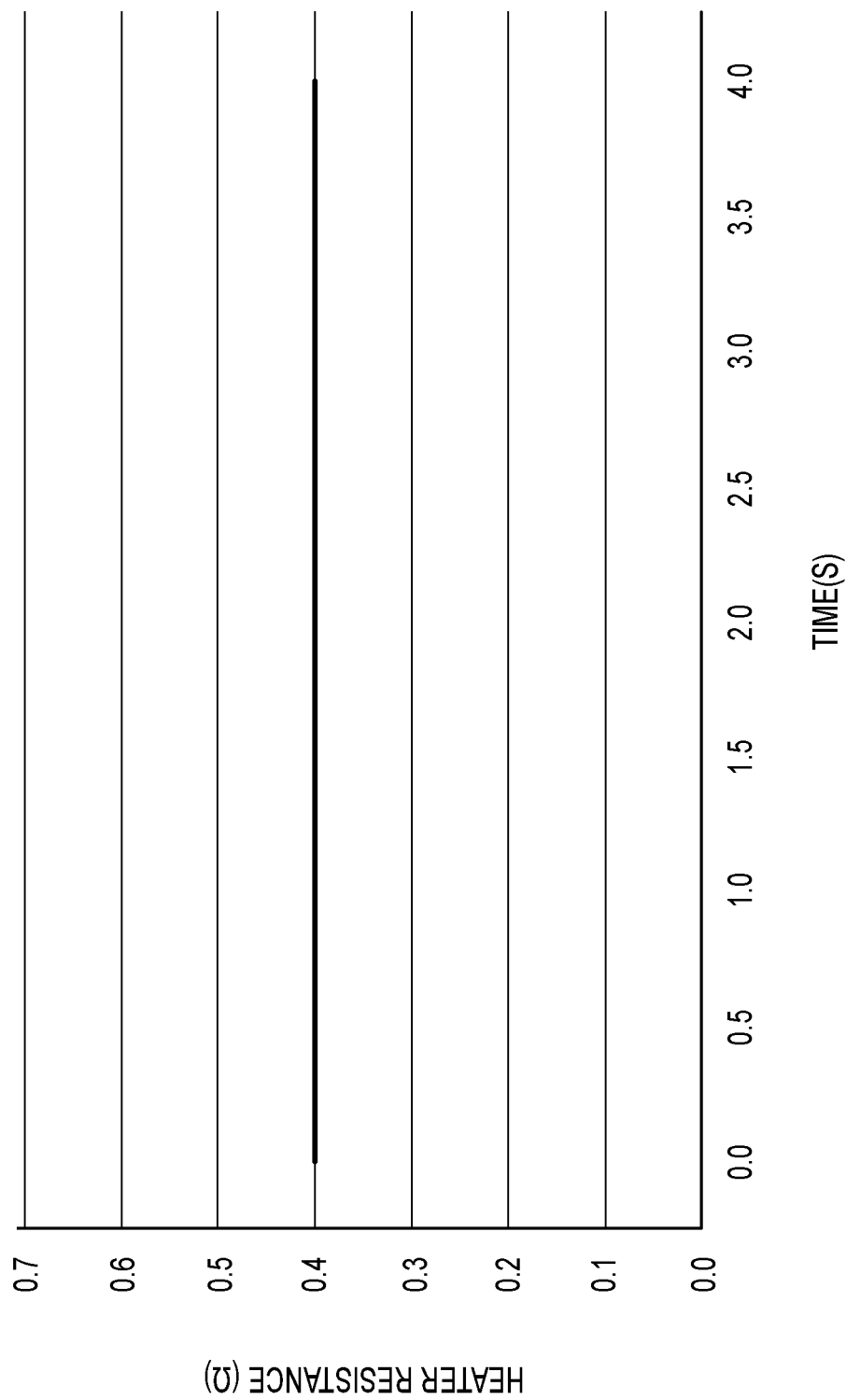

METHODS AND APPARATUS FOR A POWER SUPPLY CONTROL CIRCUIT

BACKGROUND OF THE TECHNOLOGY

Many electronic devices employ a battery, such as a lithium ion battery, to provide the primary source of power to the electronic device. In some applications, such as an electronic cigarette (also referred to as vaping devices, e-cigarettes, vape pens, and nicotine vaporizers), the battery powers a heating element that is used to heat a liquid to form a vapor. Some conventional systems use an open-loop heating method that may result in the heating element reaching an undesired and/or hazardous temperature. Alternatively, other conventional systems use a closed-loop heating method, but this method requires extra circuitry, which may increase the cost of the system, increase the power loss, generate excess heat, and/or result in delayed feedback of measured parameters (e.g., voltage, current). It is desired to provide a stable power supply to the heating element for optimal operation using minimal circuitry.

SUMMARY OF THE INVENTION

Various embodiments of the present technology comprise a method and apparatus for a power supply control circuit. In various embodiments, the apparatus is adapted to control the power supplied by a battery to a heating element. The apparatus may comprise a memory for storing known data and circuitry configured to control the delivery of power from the battery to the heating element according to measured parameters, calculated parameters, and the known data.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates an electronic system having a heating element powered by a battery in accordance with an exemplary embodiment of the present technology;

FIG. 5C is a graph illustrating a third relationship between heater element resistance values and time in accordance with the present technology;

Figure 9:
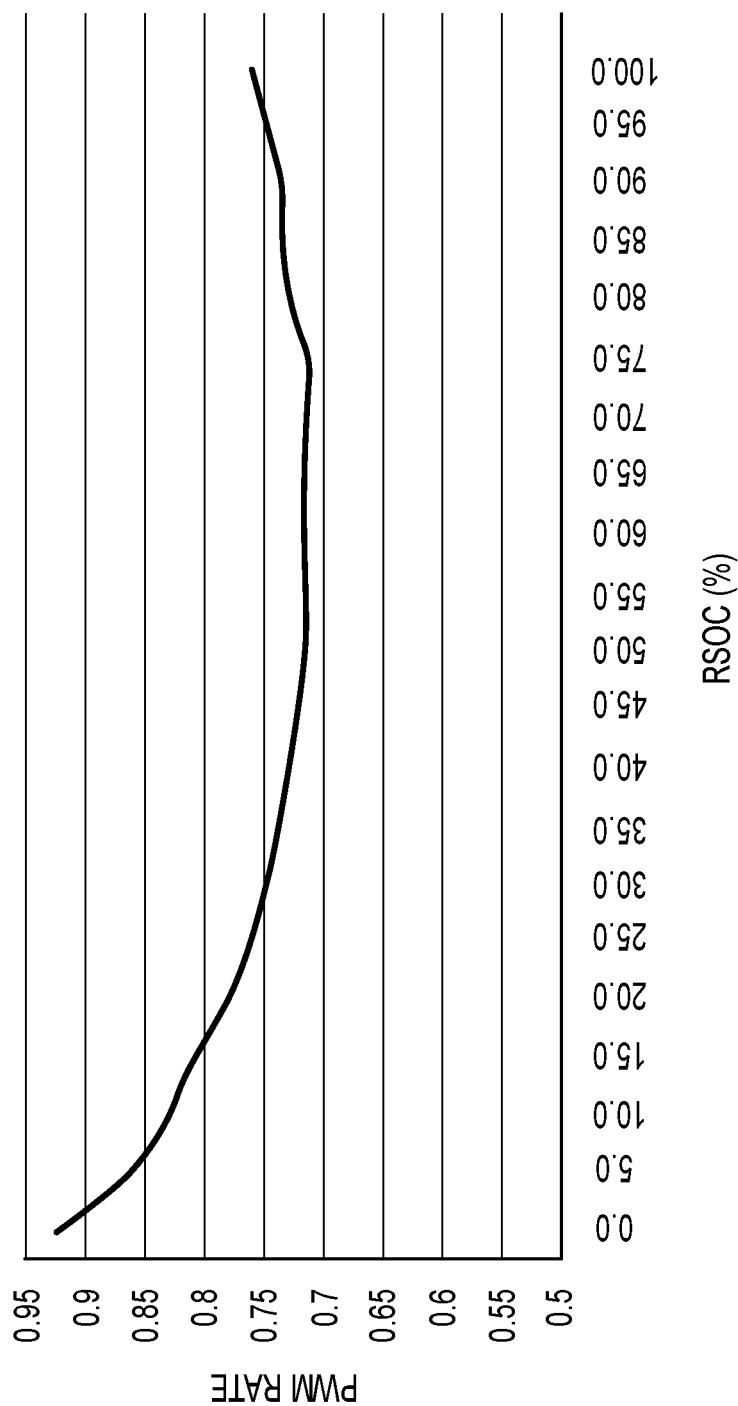
Figure 10:
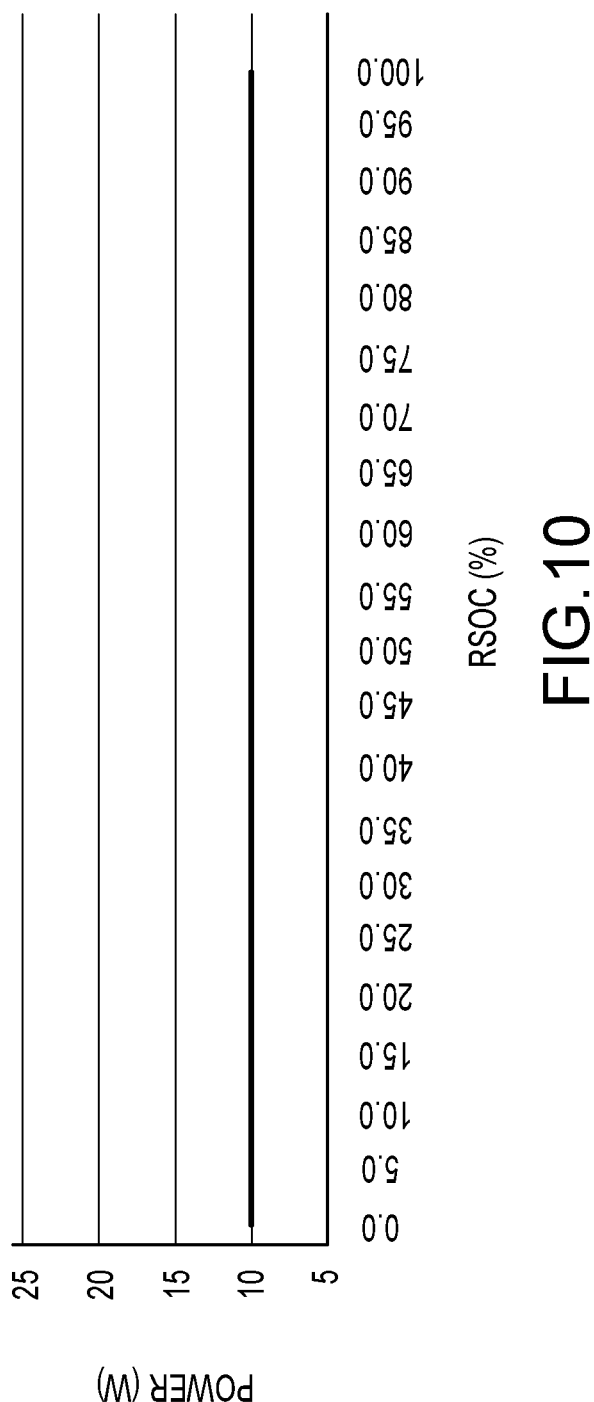

FIG. 9 is a graph illustrating an exemplary relationship between PWM rates used to supply a constant power to the heater element and battery capacity values according to an exemplary embodiment of the present technology; and FIG. 10 is a graph illustrating a relationship between heater power and battery capacity values after adjusting the PWM rate according to the PWM rates illustrated in FIG. 9 in accordance with an embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various heating elements, signal generators, voltage sensors, current sensors, coulomb counters, logic gates, memory devices, semiconductor devices, such as transistors and capacitors, and the like, which may carry out a variety of functions. In addition, the present technology may be practiced in conjunction with any number of systems, and the systems described are merely exemplary applications for the technology. Further, the present technology may employ any number of conventional techniques for measuring voltage, measuring current, computing a capacity of the battery, carrying out various mathematical computations, storing data, and the like.

Figure 1:
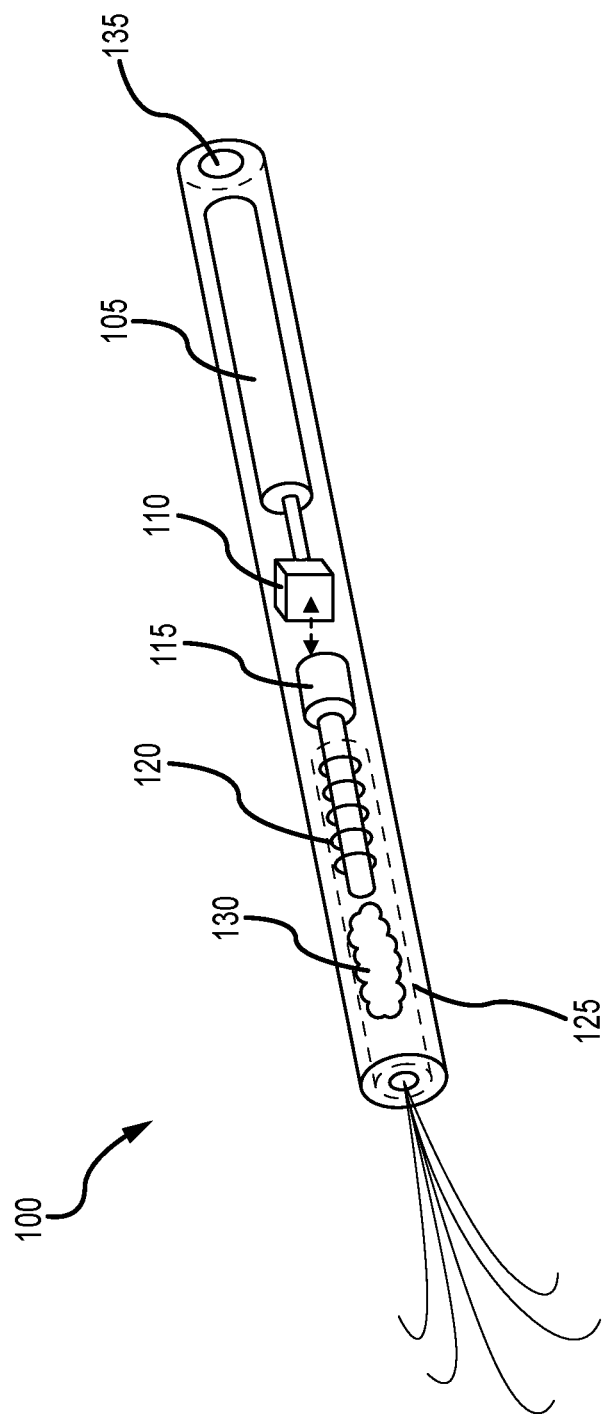

Methods and apparatus for a power supply control circuit according to various aspects of the present technology may operate in conjunction with any suitable electronic system and/or device, such as consumer electronics, portable devices, battery-powered heating devices, and the like. Referring to FIG. 1, an exemplary system 100 may comprise a heating element 120 powered by a rechargeable battery 105 and a control circuit 110 to control the amount of power supplied to heating element 120. For example, the system 100 may comprise an electronic cigarette comprising a vapor cartridge 125 containing a liquid 130. In an exemplary embodiment, the system 100 may further comprise a sensor 115 to detect when a user applies a suction force (i.e., a puff) to the electronic cigarette, which activates the heating element 120. The system 100 may further comprise a light emitting diode (LED) 135 to simulate "burning" and/or to provide a visual response to the suction force.

The battery 105 provides power to the heating element 120 and/or other components in the system 100, such as the LED 135 and the control circuit 110. The battery 105 may comprise a lithium ion battery. Alternatively, the battery 105 may comprise a nickel-metal hydride battery, a nickel cadmium battery, or a lithium-based battery, such as a lithium-cobalt, a lithium-iron-phosphate, lithium titanate or a lithium-polymer battery, and the like.

The heating element 120 may comprise an electric heater, such as an infra-red heater element, a photonic source, or an inductive heater element. The heating element 120 may be implemented as a heating wire or filament. The heating element 120 may comprise a resistive material, such as doped ceramics, electrically "conductive" ceramics (such as, for example, molybdenum disilicide), carbon, graphite, metals, metal alloys and composite materials made of a ceramic material, and/or a metallic material. Such composite materials may comprise doped or undoped ceramics. Examples of suitable doped ceramics include doped silicon carbides. Examples of suitable metals include titanium, zirconium, tantalum and metals from the platinum group. Examples of suitable metal alloys include stainless steel, nickel-, cobalt-, chromium-, aluminium-titanium-zirconium-, hafnium-, niobium-, molybdenum-, tantalum-, tungsten-, tin-, gallium-, manganese-, gold- and iron-containing alloys, and superalloys based on nickel, iron, cobalt, stainless steel, Timetal® and iron-manganese-aluminium based alloys. In composite materials, the electrically resistive material may optionally be embedded in, encapsulated or coated with an insulating material or vice-versa, depending on the kinetics of energy transfer and the external physicochemical properties desired.

The control circuit 110 controls and/or manages the functions of the battery 105, the heating element 120, and the LED 135 according to various input signals, such as input signals from the sensor 115. The control circuit 110 may comprise an integrated circuit comprising various circuits and/or systems that operate together to provide the desired outputs and/or control signals.

According to an exemplary embodiment, the control circuit 110 is connected to the battery 105 and may measure various battery characteristics, such as voltage, current, temperature, and the like.

Figure 2:
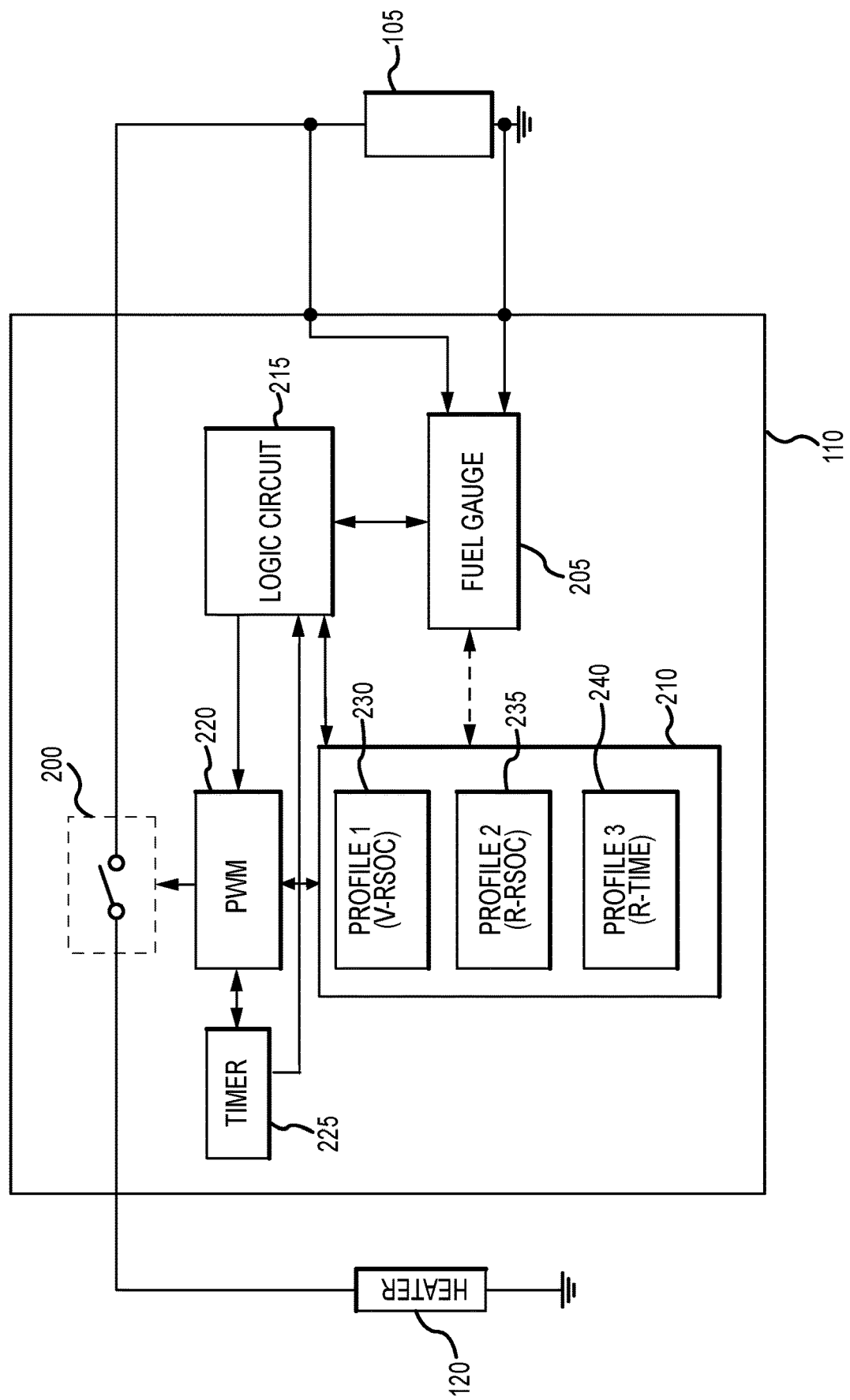
FIG. 2 is a block diagram of the electronic system in accordance with an exemplary embodiment of the present technology.

According to an exemplary embodiment, and referring to FIG. 2, the control circuit 110 comprises a fuel gauge circuit 205, a logic circuit 215, a memory 210, a signal generator circuit 220, and a timer 225 that operate together to control or otherwise manage various functions of the system 100, such as controlling power to the heating element 120, battery management (e.g., charging/discharging cycles), and the like. The control circuit 110 may be formed as an integrated circuit on a single chip or integrated across multiple chips.

According to an exemplary embodiment, the control circuit 110 selectively connects the battery 105 to the heating element 120. For example, the control circuit 110 may comprise a switch 200 positioned between a terminal of the battery 105 and the heating element 120 that operates to electrically connect and disconnect the battery 105 to/from the heating element 120. The switch 200 may comprise any device suitable for providing selective connection between two or more devices.

The switch 200 may comprise a transistor such as a field effect transistor (FET) that uses an electric field to control the electrical behavior of the device. Many different implementations of field effect transistors exist. A field effect transistor may be a desired implementation since it generally displays very high input impedance at low frequencies. The conductivity between a drain terminal and a source terminal is controlled by an electric field in the device, which is generated by a voltage difference between a body and a gate of the device.

Figure 3:
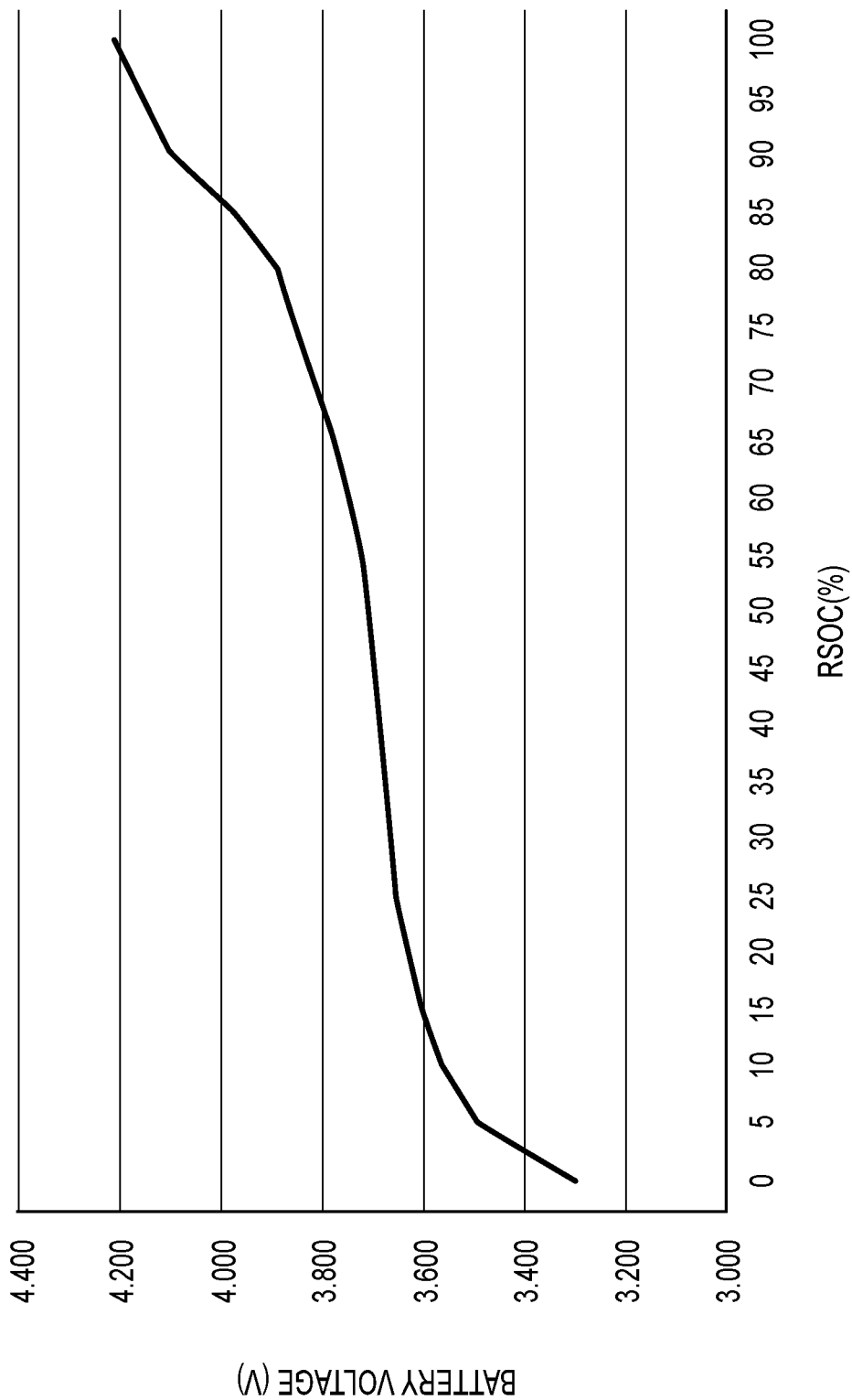
FIG. 3 is a graph illustrating a relationship between battery voltage values and battery capacity values in accordance with an exemplary embodiment of the present technology.

The memory 210 stores various battery data. In an exemplary embodiment, the memory 210 may comprise a first profile 230 that comprises known data that provides a relationship between battery voltage values and capacity values, such as the data illustrated in the graph of FIG. 3. In general, the battery voltage is generally higher at higher RSOC values and is lower at lower RSOC values. The specific data contained in the first profile 230 may be determined by testing the battery 105 in an environment that simulates the system 100 in which the battery 105 will be used. The first profile 230 may be implemented as a look-up table or any other suitable storage device that is accessible by the logic circuit 215 and/or the fuel gauge circuit 205.

Figure 4:
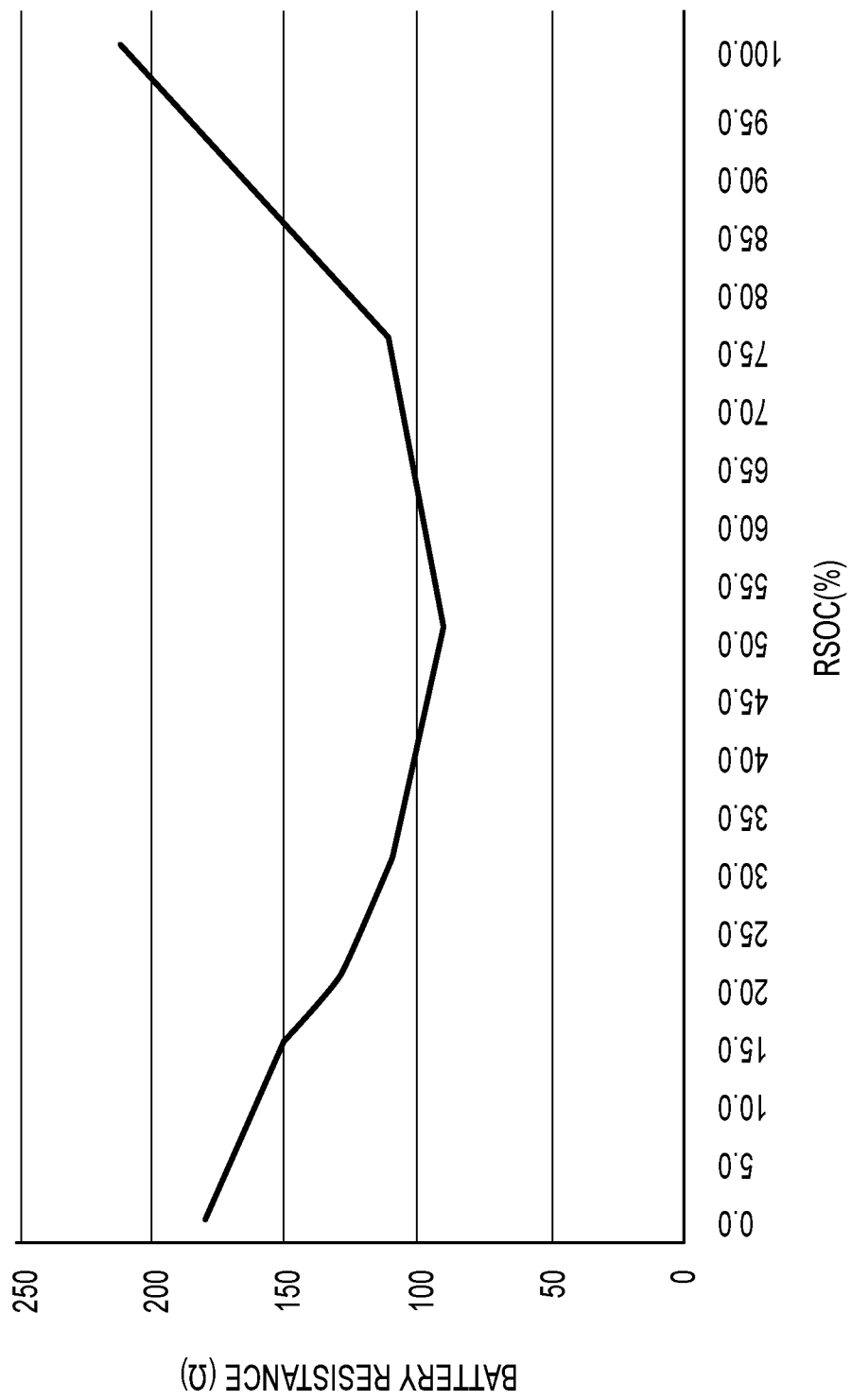
FIG. 4 is a graph illustrating a relationship between battery resistance values and battery capacity values in accordance with an exemplary embodiment of the present technology.

In an exemplary embodiment, the memory 210 further comprises a second profile 235 that comprises known data that provides a relationship between battery resistance values and capacity values, such as the data illustrated in the graph of FIG. 4. The specific data contained in the second profile 235 may be determined by testing the battery 105 in an environment that simulates the system 100 in which the battery 105 will be used. The second profile 235 may be implemented as a look-up table or any other suitable storage device that is accessible by the logic circuit 215 and/or the fuel gauge circuit 205.

Figure 5A:
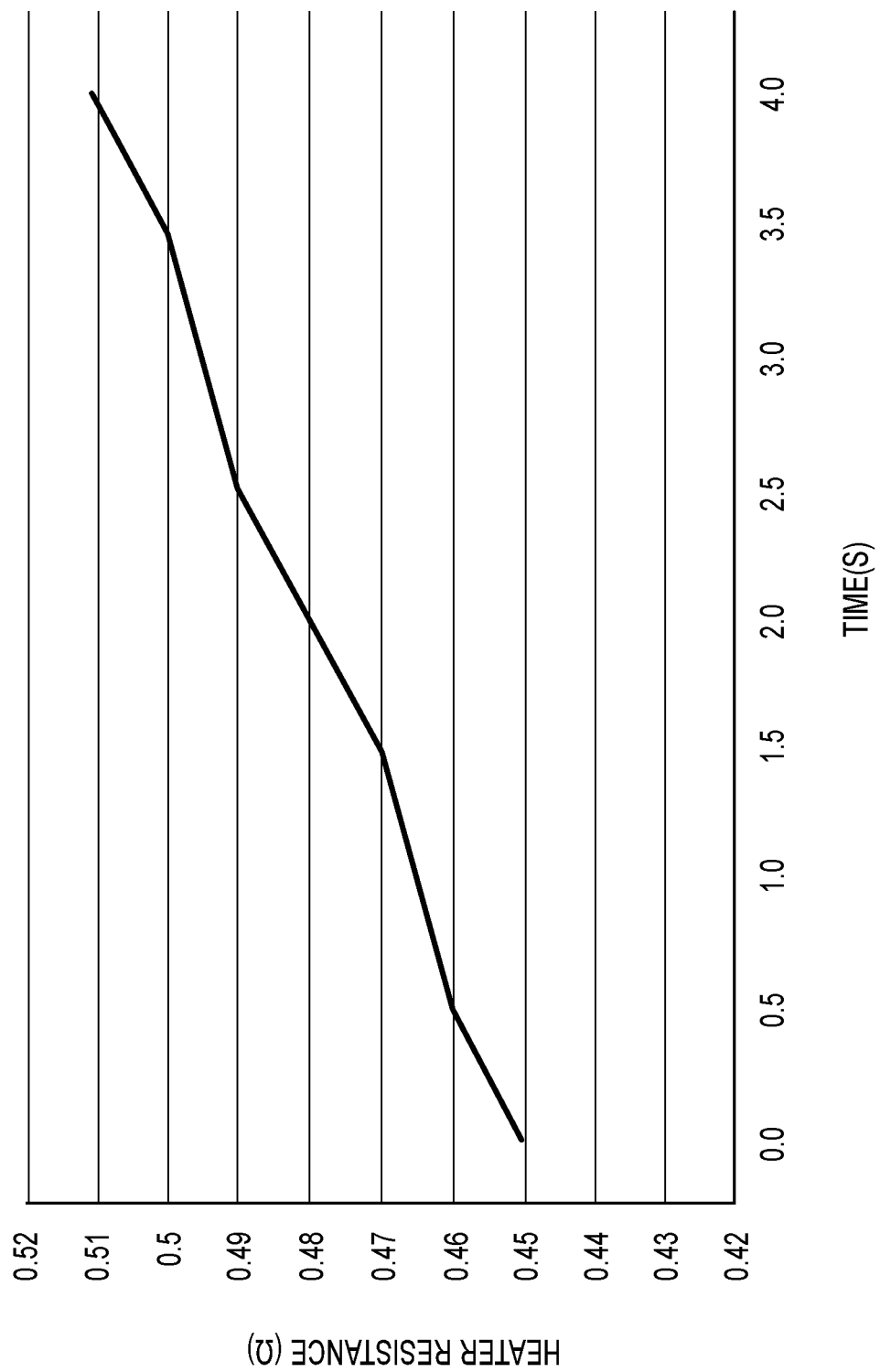
FIG. 5A is a graph illustrating a first relationship between heater element resistance values and time in accordance with the present technology.
Figure 5B:
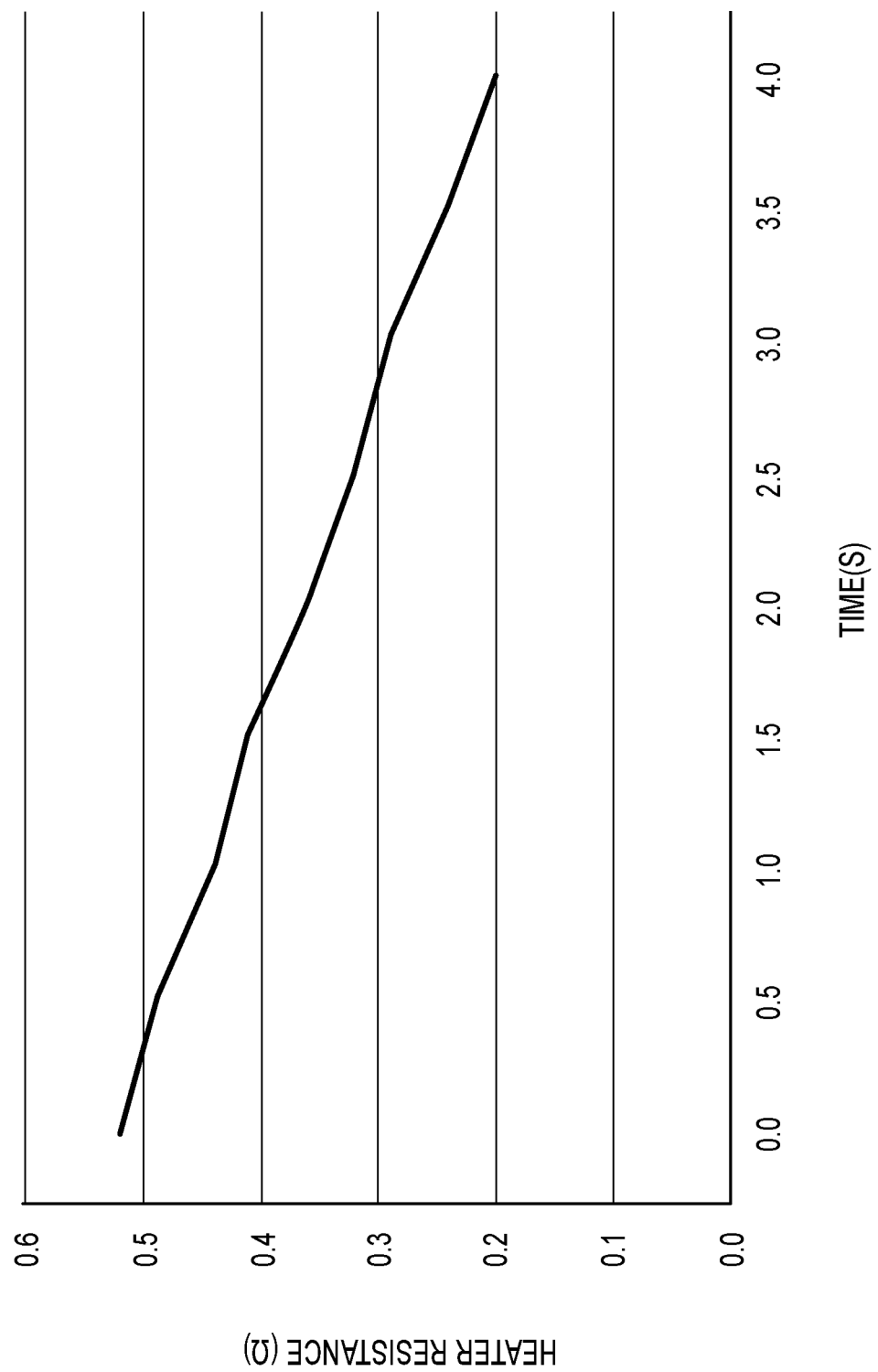
FIG. 5B is a graph illustrating a second relationship between heater element resistance values and time in accordance with the present technology.
Figure 6:
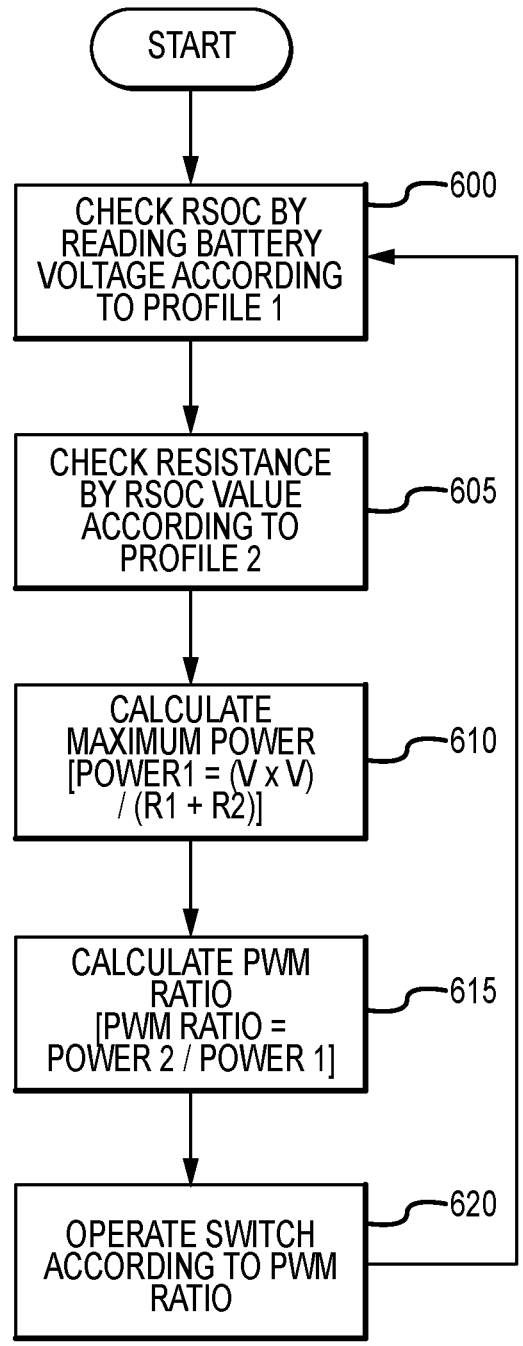
FIG. 6 is a flowchart for controlling delivery of power from a battery to a heating element in accordance with an exemplary embodiment of the present technology.
Figure 7:
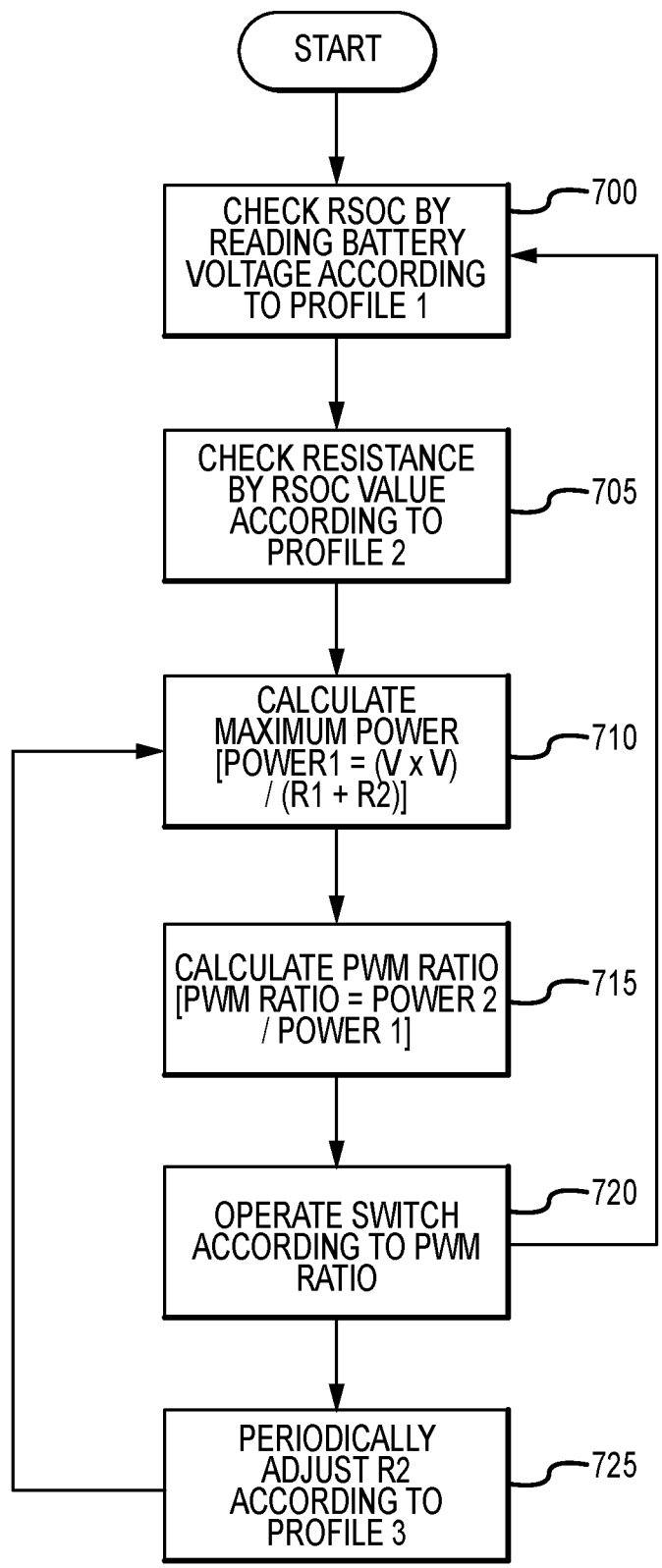
FIG. 7 is an alternative flowchart for controlling delivery of power from a battery to a heating element in accordance with an exemplary embodiment of the present technology.

The memory may further comprise a third profile 240 comprising known heater element data that provides a relationship between heater element resistance values and time, such as the data illustrated in the graphs of FIG. 5A-5C. The specific data contained in the third profile 240 may be determined by testing the heating element 120 in an environment that simulates the system 100 in which the heating element 120 will be used. In general, when power is applied to the heater element 120 it has an initial resistance at time 0, and the heater element resistance may increase, decrease, or remain constant over time according to its material characteristic. The third profile 240 may be implemented as a look-up table or any other suitable storage device that is accessible by the logic circuit 215 and/or the fuel gauge circuit 205.

The memory 210 may be further configured to store a predetermined target power value 'Power2'. The predetermined target power value 'Power2' may vary according the specifications of the particular system implementation. For example, the predetermined target power value 'Power2' may be based on various heating element specifications, such as a maximum power rating and maximum current rating of the heating element 120, as well as various battery specifications, such as the type of battery (e.g., lithium ion, NiCd, NiMH etc.), reference voltage of the battery, nominal voltage of the battery, charge current of the battery, and the like.

The memory 210 may be implemented as a random access memory (RAM), a read only memory (ROM), or a nonvolatile memory, such as a flash memory. The particular memory implementation may be selected according the particular implementation of the system 100, as one type of memory may be more suitable for a particular implementation of the system 100.

The fuel gauge circuit 205 may be configured to receive various inputs, monitor and/or measure various battery characteristics, such as the voltage, the current, the battery capacity (which may also be expressed as a state of charge (SOC) or relative state of charge (RSOC) as a percentage), operation mode (e.g., charging and discharging) of the battery, a state of health (SOH), and the like. The fuel gauge circuit 205 may also generate various types of control signals in response to received input signals and/or the battery characteristics, such as control signals to control charging and discharging. The fuel gauge circuit 205 may comprise any number of suitable circuits and/or systems and may be implemented in any suitable manner, such as in the form of a large scale integrated (LSI) circuit.

According to an exemplary embodiment, the fuel gauge circuit 205 is configured to retrieve relevant data from the first profile 230 and utilize the relevant data to determine a capacity (RSOC) of the battery 105. For example, the fuel gauge circuit 205 may first measure an actual voltage of the battery 105 using conventional voltage-sensing methods and techniques. The fuel gauge circuit 205 may then determine the battery capacity according to the measured actual voltage and the first profile 230. For example, a measured actual voltage of 3.6V corresponds to an RSOC of 15%.

The fuel gauge circuit 205 may also be configured to determine a resistance of the battery 105. For example, the fuel gauge circuit 205 may utilize a previously-determined battery capacity (RSOC) and the second profile 235 to determine the resistance. For example, an RSOC of 15% corresponds to a resistance value of 150 ohms. The fuel gauge circuit 205 may be configured to transmit the determined resistance value to the logic circuit 215.

The logic circuit 215 may be configured to perform various calculations, extract data from the memory 210, receive relevant data as it relates to the battery 105 and/or the heating element 120, and/or supply various control signals. For example, the logic circuit 215 may be connected to the fuel gauge circuit 205 and/or the memory 210. According to an exemplary embodiment, the logic circuit 215 may be further connected to and provide a first control signal to the signal generator circuit 220. The logic circuit 215 may comprise any suitable devices and/or systems, and may be realized by the use of hardware, logic gates, and the like.

According to an exemplary embodiment, the logic circuit 215 is configured to compute a maximum power value 'Power1', where the maximum power value is described as Power1=$V^2$/(R1+R2) (Equation 1), where V is a measured actual voltage of the battery 105, R1 is a determined resistance value of the battery 105, and R2 is a resistance value of the heating element 120.

The logic circuit 215 may be configured to retrieve the resistance value R2 of the heating element 120 from the third profile 240. For example, the resistance value R2 of the heating element 120 may be a starting resistance (the resistance value at time 0) or may be a resistance value during operation (a resistance value after time 0). Accordingly, the logic circuit 215 may select the appropriate resistance value based on the length of time the heating element 120 has been operating.

According to various embodiments, the logic circuit 215 may further compute a battery current I according to the determined battery resistance R1 and the measured battery voltage (i.e., I=V/R). The logic circuit 215 may then confirm the RSOC value by utilizing a fourth profile (not shown)—for example, stored in the memory 210—that describes a relationship of battery current and RSOC values.

The signal generator circuit 220 generates a second control signal to operate the switch 200. According to an exemplary embodiment, the signal generator circuit 220 may be implemented as a pulse width modulation circuit that generates a PWM signal having a square wave and a variable duty cycle. The pulse width modulation circuit may comprise a conventional circuit. The duty cycle of the PWM signal is a ratio of the predetermined target power 'Power2' value to the calculated maximum power 'Power1' (i.e., PWM=Power2/Power1 (Equation 2)). Accordingly, when the PWM signal is HIGH, the switch 200 responds by closing (switch is ON), thereby connecting the battery 105 to the heating element 120. In contrast, when the PWM signal is LOW, the switch 200 responds by opening (switch is OFF), thereby disconnecting the battery 105 from the heating element 120.

According to various embodiments, the control circuit 110 may further comprise a timer circuit 225 to track and measure a time interval (period of time). For example, the timer circuit 225 may start measuring when the switch 200 is first closed (t=0) and transmit a timer signal to logic circuit 215 when the timer circuit 225 reaches a predetermined timer value, such as every 100 ms. When the logic circuit 215 receives the timer signal, the logic circuit 215 re-computes the maximum power value 'Power1' according to a new heating element resistance value that corresponds to that particular timer value. The logic circuit 215 may retrieve the new heating resistance value from the third profile 240.

In an exemplary operation, and referring to FIGS. 1, 3, 4, and 6, the control circuit 110 may first measure the actual voltage of the battery 105. The control circuit 110 may then utilize the measured actual voltage in conjunction with the first profile 230 to determine the RSOC of the battery 105 (600). For example, the fuel gauge circuit 205 may retrieve—from the memory 210—the RSOC value that corresponds to the measured actual voltage.

The control circuit 110 may then utilize the determined RSOC (from step 600) in conjunction with the second profile 235 to determine a battery resistance (605). For example, the fuel gauge circuit 205 may retrieve—from the memory 210—the resistance value that corresponds to the determined RSOC.

The control circuit 110 may then calculate the maximum power 'Power1' according to the measured actual voltage, the battery resistance value R1, and a heating element resistance value R2 (610). For example, the logic circuit 215 may receive and/or retrieve the measured actual voltage of the battery, the battery resistance value R1, and the heating element resistance value R2 from the fuel gauge circuit and/or the memory 210.

The control circuit 110 may then compute the PWM signal (615), where the PWM signal is defined as the predetermined power divided by the maximum power (i.e., Power2/Power1). For example, the signal generator circuit 220 may receive the calculated maximum power 'Power1' from the logic circuit 215 and may retrieve the predetermined target power value 'Power2' from the memory 210.

The control circuit 110 may then operate the switch 200 according to the PWM signal (620). For example, if the PWM signal is 50%, then for 1 duty cycle, the switch 200 is closed for half of the time and open the other half. Similarly, if the PWM signal is 30%, then for 1 duty cycle, the switch is closed for 30% of the time, and open for 70% of the time.

The present operation may be used if the resistance characteristics of the heater element 120 are constant over time, such as illustrated in FIG. 5C.

In an alternative operation, and referring to FIGS. 1, 3, 4, 5A, 5B, and 7, the control circuit 110 may first measure the actual voltage of the battery 105. The control circuit 110 may then utilize the measured actual voltage in conjunction with the first profile 230 to determine the RSOC of the battery 105 (700). For example, the fuel gauge circuit 205 may retrieve—from the memory 210—the RSOC value that corresponds to the measured actual voltage.

The control circuit 110 may then utilize the determined RSOC (from step 700) in conjunction with the second profile 235 to determine a battery resistance (705). For example, the fuel gauge circuit 205 may retrieve—from the memory 210—the resistance value that corresponds to the determined RSOC.

The control circuit 110 may then calculate the maximum power 'Power1' according to the measured actual voltage, the battery resistance value R1, and a heating element resistance value R2 (710). For example, the logic circuit 215 may receive and/or retrieve the measured actual voltage of the battery, the battery resistance value R1, and the heating element resistance value R2 from the fuel gauge circuit and/or the memory 210.

The control circuit 110 may then compute the PWM signal (715), where the PWM signal is defined as the predetermined power divided by the maximum power (i.e., Power2/Power1). For example, the signal generator circuit 220 may receive the calculated maximum power 'Power1' from the logic circuit 215 and may retrieve the predetermined target power value 'Power2' from the memory 210.

The control circuit 110 may then operate the switch 200 according to the PWM signal (720). For example, if the PWM signal is 50%, then for 1 duty cycle, the switch 200 is closed for half of the time and open the other half. Similarly, if the PWM signal is 30%, then for 1 duty cycle, the switch is closed for 30% of the time, and open for 70% of the time.

According to the present embodiment, the control circuit 110 may periodically adjust the heating element resistance value R2 used to calculate the maximum power 'Power1' (725). For example, after a predetermined period of time, such as 100 ms, the logic circuit 215 may retrieve a new resistance value R2 that corresponds to the elapsed time and compute a new maximum power. Since the heating element resistance R2 increases with time, the new maximum power value will be less than the value computed at time 0. The signal generator circuit 220 may then use the new maximum power value to update the PWM ratio and the signal generator circuit 220 will operate the switch 200 accordingly.

The present operation may be used if the resistance characteristics of the heater element 120 vary (increase or decrease) over time, such as illustrated in FIGS. 5A and 5B. Therefore, the heating element resistance value R2 may be adjusted periodically. For example, when the timer 225 reaches the predetermined elapsed time, the logic unit 215 recalculates the maximum power 'Power1' where the variable 'R1' in Equation 1 above is the updated heating element resistance value that corresponds to the elapsed time. In contrast, if the heating element 120 exhibits stable characteristics, such as illustrated in FIG. 5C, then Equation 1 above is calculated using an initial heating element resistance value—in other words, the variable 'R2' is the initial heating element resistance value at time 0.

Figure 8:
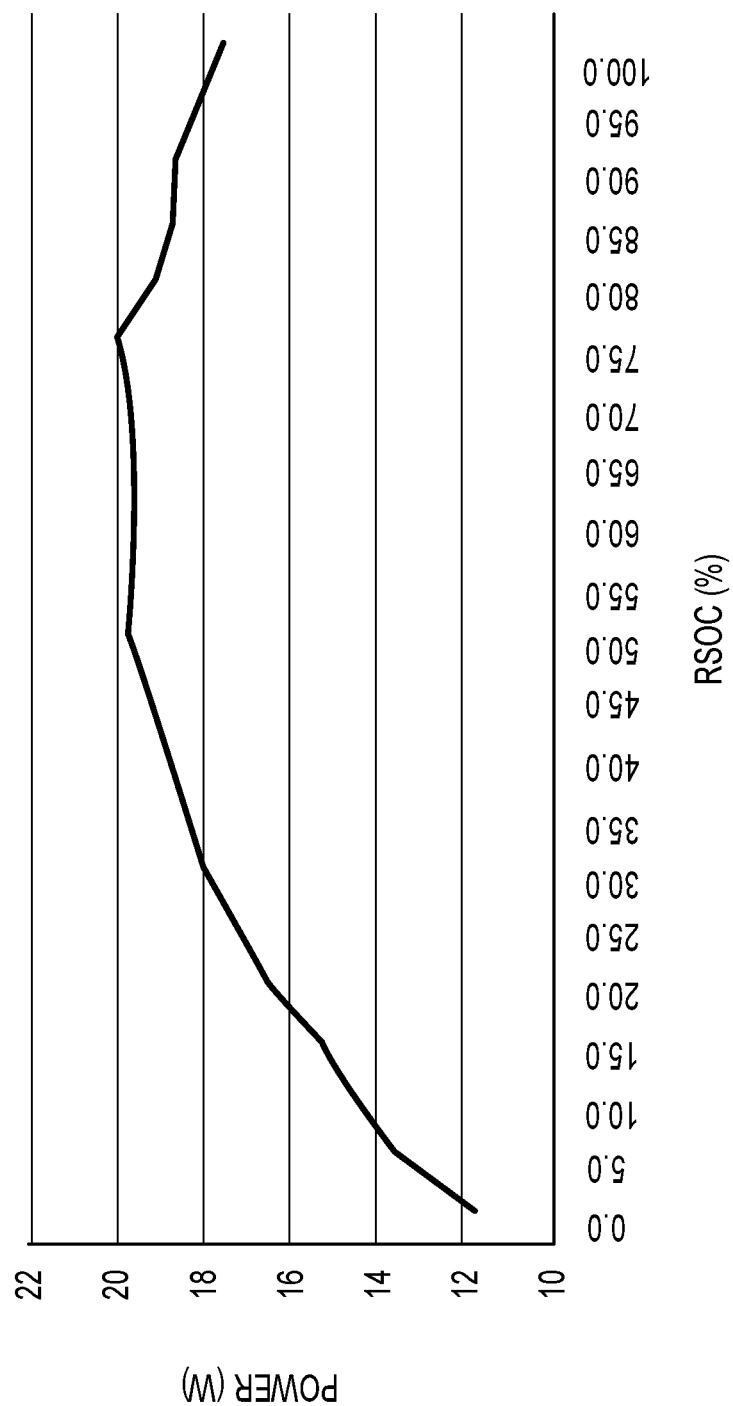
FIG. 8 is a graph illustrating a relationship between heater power and battery capacity values when a PWM rate is 100%.

In a conventional system, the power supplied to the heating element 120 from the battery 105 is not stable across various battery capacity values (e.g., as illustrated in FIG. 8). Embodiments of the present technology, however, adjust the PWM rate during operation (e.g., as illustrated in FIG. 9), and therefore, the battery 105 provides a stable supply power to the heating element 120 (e.g., as illustrated in FIG. 10).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages, and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A control circuit adapted to control a heating element powered by a battery, comprising:
    a memory configured to store known battery data comprising a first profile and a second profile;
    a fuel gauge circuit in communication with the memory and the battery and configured to determine a resistance of the battery according to the first and second profiles;
    a logic circuit connected to the fuel gauge circuit and configured to calculate a first power value based on the determined resistance; and
    a signal generator circuit responsive to the logic circuit and configured to generate a control signal according to the calculated first power value;

wherein the control circuit selectively connects the battery to the heating element according to the control signal.

2. The control circuit of claim 1, wherein determining the resistance of the battery comprises:
measuring an actual voltage of the battery;
utilizing the first profile to determine a capacity of the battery according to the measured actual voltage; and
utilizing the second profile to determine the resistance of the battery according to the determined capacity.

3. The control circuit of claim 1, wherein the logic unit calculates the first power further based on a first resistance value of the heating element at a start time.

4. The control circuit of claim 3, wherein the memory further comprises a third profile comprising a relationship between resistance values of the heating element and time.

5. The control circuit of claim 4, further comprising a timer to measure an elapsed operation time, wherein the elapsed operation time is measured from the start time.

6. The control circuit of claim 5, wherein, when the timer reaches a predetermined elapsed operation time, the logic unit calculates a new first power according to:
a second resistance value of the heating element; and
the third profile.

7. The control circuit claim 1, further comprising a switch positioned between the battery and the heating element, wherein the switch is responsive to the control signal and electrically connects the battery to the heating element.

8. The control circuit of claim 1, wherein:
the first profile comprises a relationship between battery voltage values and battery capacity values; and
the second profile comprises a relationship between battery resistance values and the battery capacity values.

9. The control circuit of claim 1, wherein the control signal comprises a ratio of a predetermined target power to the calculated first power.

10. A method for controlling the delivery of power from a battery to a heating element, comprising:
measuring an actual voltage of the battery;
determining a capacity of the battery according to the measured actual voltage and first known battery data;
determining a resistance of the battery according to the determined capacity and second known battery data;
calculating a first power according to the determined resistance of the battery and a resistance of the heating element;
calculating a ratio of a predetermined target power and the calculated first power; and
electrically connecting the battery to the heating element according to the calculated ratio.

11. The method of claim 10, wherein the resistance of the heating element is an initial resistance value of the heating element when the heating element is new.

12. The method of claim 10, wherein: the first known battery data comprises a relationship between voltage values and capacity values; and the second known battery data comprises a relationship between resistance values of the battery and the capacity values.

13. The method of claim 10, further comprising:
measuring an elapsed operation time; and
determining an aged resistance value of the heating element, comprising:
utilizing known heating element data and the elapsed operation time value.

14. The method of claim 13, wherein the resistance of the heating element is the determined aged resistance.

15. A system for powering a heating element, comprising:
a battery configured to provide power to the heating element; and
a control circuit configured to control delivery of the power from the battery to the heating element according to a control signal;
wherein:
the control signal is based on a calculated first power and a predetermined target power; and
the calculated first power is based on:
a resistance of the heating element; and
a resistance of the battery.

16. The system of claim 15, wherein the control circuit comprises a memory configured to store:
a first profile comprising a relationship between battery voltage values and battery capacity values; and
a second profile comprising a relationship between battery resistance values and the battery capacity values.

17. The system of claim 16, wherein the control circuit is further configured to:
measure an actual voltage of the battery; and
determine an actual capacity of the battery according to the measured actual voltage and the first profile.

18. The system of claim 16, wherein the control circuit is further configured to determine the resistance the battery according to a measured actual capacity of the battery and the second profile.

19. The system of claim 16, wherein the memory is further configured to store a third profile comprising a relationship between resistance values of the heating element and time.

20. The system of claim 15, wherein the control signal is a ratio of the predetermined target power to the calculated first power.

* * * * *